United States Patent
Chan et al.

(10) Patent No.: US 9,966,468 B2
(45) Date of Patent: May 8, 2018

(54) SEMICONDUCTOR DEVICE HAVING REVERSE U-SHAPED EPITAXIAL LAYER AND METHOD FOR FABRICATING THE SAME

(71) Applicant: UNITED MICROELECTRONICS CORP., Hsin-Chu (TW)

(72) Inventors: Tien-Chen Chan, Tainan (TW); Yi-Fan Li, Tainan (TW); Li-Wei Feng, Kaohsiung (TW); Ming-Hua Chang, Tainan (TW); Yu-Shu Lin, Pingtung County (TW); Shu-Yen Chan, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 3 days.

(21) Appl. No.: 15/214,429

(22) Filed: Jul. 19, 2016

(65) Prior Publication Data

US 2017/0373191 A1    Dec. 28, 2017

(30) Foreign Application Priority Data

Jun. 28, 2016    (CN) .......................... 2016 1 0490392

(51) Int. Cl.
*H01L 29/78*    (2006.01)
*H01L 29/66*    (2006.01)
*H01L 21/02*    (2006.01)
*H01L 29/06*    (2006.01)

(52) U.S. Cl.
CPC ...... *H01L 29/7851* (2013.01); *H01L 21/0217* (2013.01); *H01L 21/02164* (2013.01); *H01L 29/0649* (2013.01); *H01L 29/66795* (2013.01)

(58) Field of Classification Search
CPC ......... H01L 29/7851; H01L 21/823431; H01L 2924/1306; H01L 2029/7858; H01L 21/3147; H01L 29/7848; H01L 29/66795; H01L 29/785
See application file for complete search history.

(56) References Cited

U.S. PATENT DOCUMENTS

| 8,809,947 | B1 | 8/2014 | Akarvardar et al. |
| 2014/0367795 | A1* | 12/2014 | Cai ............... H01L 27/0886 257/392 |
| 2015/0187577 | A1* | 7/2015 | Basker ............. H01L 21/02694 257/401 |

* cited by examiner

*Primary Examiner* — Mohsen Ahmadi
(74) *Attorney, Agent, or Firm* — Winston Hsu

(57) ABSTRACT

A method for fabricating semiconductor device is disclosed. First, a fin-shaped structure is formed on a substrate, a first liner is formed on the substrate and the fin-shaped structure, a second liner is formed on the first liner, part of the second liner and part of the first liner are removed to expose a top surface of the fin-shaped structure, part of the first liner between the fin-shaped structure and the second liner is removed to form a recess, and an epitaxial layer is formed in the recess.

16 Claims, 5 Drawing Sheets

SEMICONDUCTOR DEVICE HAVING REVERSE U-SHAPED EPITAXIAL LAYER AND METHOD FOR FABRICATING THE SAME

BACKGROUND OF THE INVENTION

1. Field of the Invention

The invention relates to a method for fabricating semiconductor device, and more particularly to a method of forming epitaxial layer on a fin-shaped structure to serve as channel for the semiconductor device.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a method for fabricating semiconductor device is disclosed. First, a fin-shaped structure is formed on a substrate, a first liner is formed on the substrate and the fin-shaped structure, a second liner is formed on the first liner, part of the second liner and part of the first liner are removed to expose a top surface of the fin-shaped structure, part of the first liner between the fin-shaped structure and the second liner is removed to form a recess, and an epitaxial layer is formed in the recess.

According to another aspect of the present invention, a semiconductor device is disclosed. The semiconductor device include: a substrate; a fin-shaped structure on the substrate; an epitaxial layer on the fin-shaped structure, and a shallow trench isolation (STI) around the epitaxial layer. Preferably, the epitaxial layer contacts a top surface and sidewalls of the fin-shaped structure and a top surface of the substrate, the epitaxial layer is reverse U-shaped, and the STI contacts the substrate directly.

According to yet another aspect of the present invention, a semiconductor device is disclosed. The semiconductor device includes: a substrate; a fin-shaped structure on the substrate; an epitaxial layer on the fin-shaped structure, a shallow trench isolation (STI) around the epitaxial layer, and a spacer between the STI and the epitaxial layer. Preferably, the epitaxial layer contacts a top surface and sidewalls of the fin-shaped structure and a top surface of the substrate, and the epitaxial layer is reverse U-shaped;

These and other objectives of the present invention will no doubt become obvious to those of ordinary skill in the art after reading the following detailed description of the preferred embodiment that is illustrated in the various figures and drawings.

DETAILED DESCRIPTION

Figure 1:
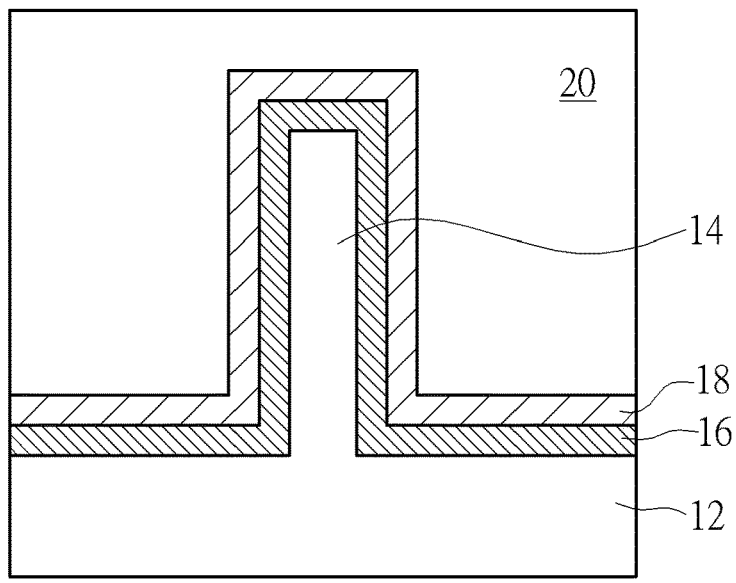
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a silicon substrate or silicon-on-insulator (SOI) substrate is provided, and at least a fin-shaped structure 14 is formed on the substrate 12.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred to the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structures are all within the scope of the present invention.

Next, a first liner 16 is formed on the substrate 12 to cover the fin-shaped structure 14 entirely, a second liner 18 is formed on the surface of the first liner 16, and a sacrificial layer 20 is formed on the second liner 18. In this embodiment, the first liner 16 and the second liner 18 are preferably composed of different material. For instance, the first liner 16 is preferably made of silicon oxide, the second liner 18 is made of silicon nitride, and the sacrificial layer 20 is made of silicon oxide, but not limited thereto.

Figure 2:
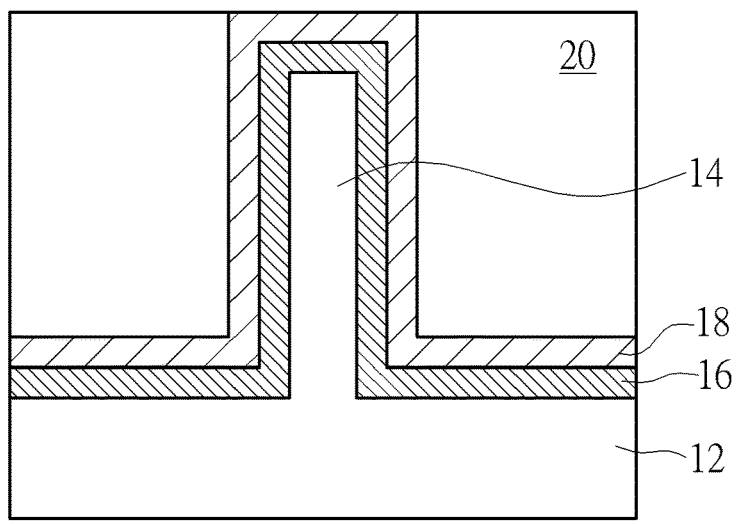

Next, as shown in FIG. 2, a planarizing process, such as chemical mechanical polishing (CMP) process is conducted to remove part of the sacrificial layer 20 to expose atop surface of the second liner 18 so that the top surfaces of the second liner 18 and the remaining sacrificial layer 20 are coplanar.

Figure 3:
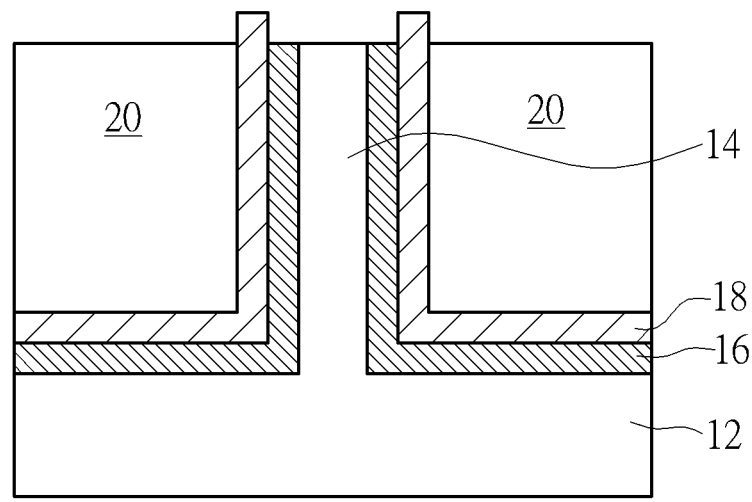

Next, as shown in FIG. 3, at least an etching process, such as dry etching is conducted to remove part of the second liner 18 and part of the first liner 16 to expose the top surface of the fin-shaped structure 14. It should be noted that since the first liner 16 and sacrificial layer 20 are composed of same material, part of the sacrificial layer 20 is preferably removed while removing part of the first liner 16, so that the top surface of the remaining sacrificial layer 20 is slightly lower than the top surface of the second liner 18 but even with the top surface of the first liner 16.

Figure 4:
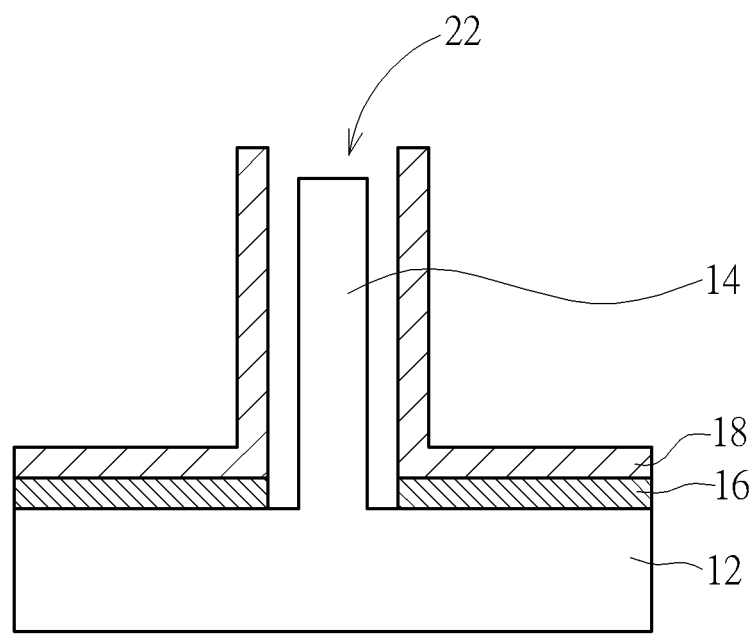

Next, as shown in FIG. 4, an etching process is conducted by using etchant such as diluted hydrofluoric acid (dHF) or SiCoNi to remove the remaining sacrificial layer 20 completely and part of the first liner 16 between the fin-shaped structure 14 and second liner 18, so that an edge of the remaining first liner 16 is aligned with an edge of the second liner 18. This forms a recess 22 between the fin-shaped structure 14 and the second liner 18, in which a cross-section of the recess 22 is reverse U-shaped and the recess 22 exposes part of the top surface of the substrate 12. It should be noted that since both the sacrificial layer 20 and the first liner 16 are composed of silicon oxide, the aforementioned etching process preferably removes all of the remaining sacrificial layer 20 and part of the first liner 16 at the same time to expose sidewalls of the second liner 18 and form the reversed U-shaped recess 22.

Figure 5:
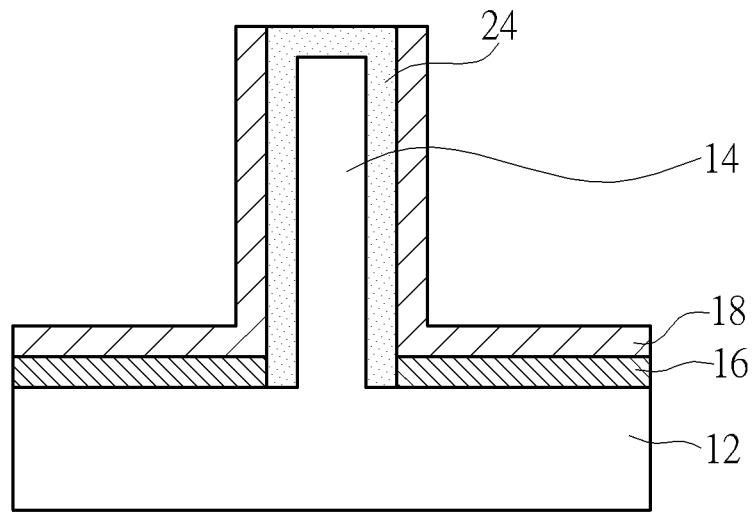

Next, as shown in FIG. 5, an epitaxial growth process is conducted to form an epitaxial layer 24 filling the recess 22. Preferably, the epitaxial layer 24 will be serving as the channel region for the FinFET device formed thereafter and the material of the epitaxial layer 24 could be different depending on the type of device being fabricated. For instance, the epitaxial layer could be composed of silicon germanium (SiGe) or silicon phosphide (SiP), but not limited thereto. It should be noted that even though the top surface of the epitaxial layer 24 could be controlled to be even with the top surface of the adjacent second liner 18 by adjusting fabrication parameters, it would also be desirable to conduct an extra planarizing process, such as using CMP to remove part of the epitaxial layer 24 so that the top surface of the epitaxial layer 24 is even with the top surface of the second liner 18, which is also within the scope of the present invention.

Figure 6:
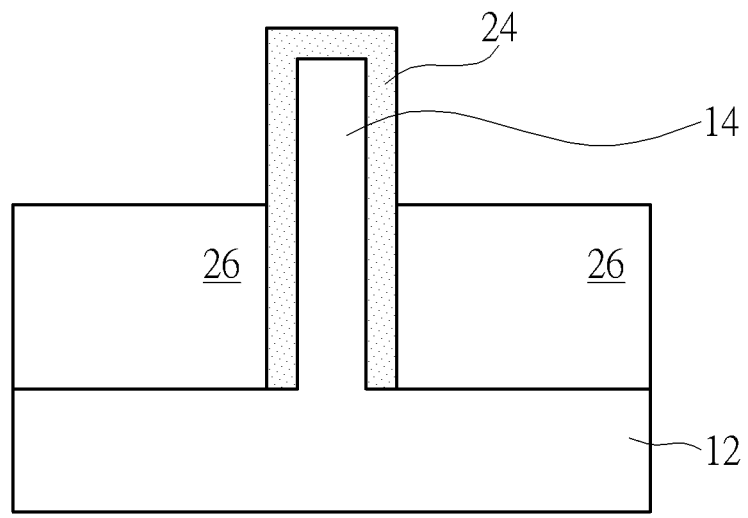

Next, as shown in FIG. 6, an etching process is conducted to remove the second liner 18 and first liner 16 completely and expose the reverse U-shaped epitaxial layer 24. Next, a shallow trench isolation (STI) process is conducted by depositing an insulating layer (not shown) on the substrate 12 to cover the epitaxial layer 24 entirely, and a planarizing process such as CMP is conducted to remove part of the insulating layer so that the top surface of the U-shaped epitaxial layer 24 is slightly lower than the top surface of the insulating layer. Next, another etching process is conducted to remove part of the insulating layer so that the top surface of the insulating layer is substantially lower than the top surface of the epitaxial layer 24 for forming a STI 26. Next, follow-up FinFET fabrication process could be carried out by forming gate structure (not shown) on the fin-shaped structure 14 and forming a source/drain region in the fin-shaped structure adjacent to two sides of the gate structure. This completes the fabrication of a semiconductor device according to a preferred embodiment of the present invention.

It should be noted that according to an embodiment of the present invention, it would also be desirable to keep or maintain a portion of the sacrificial layer 20 while removing part of the first liner 16 to form the recess 22 in FIG. 4, and part of the remaining sacrificial layer 20 could then be removed in FIG. 6 to form the STI 26 directly. By doing so, an extra step conducted for forming the STI could be omitted.

Figure 7:
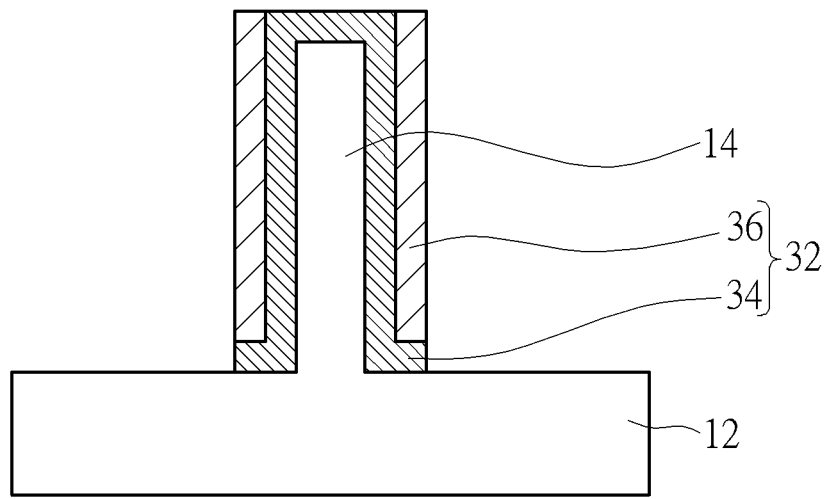
FIGS. 7-9 illustrate a method for fabricating a semiconductor device according to an embodiment of the present invention.
Figure 8:
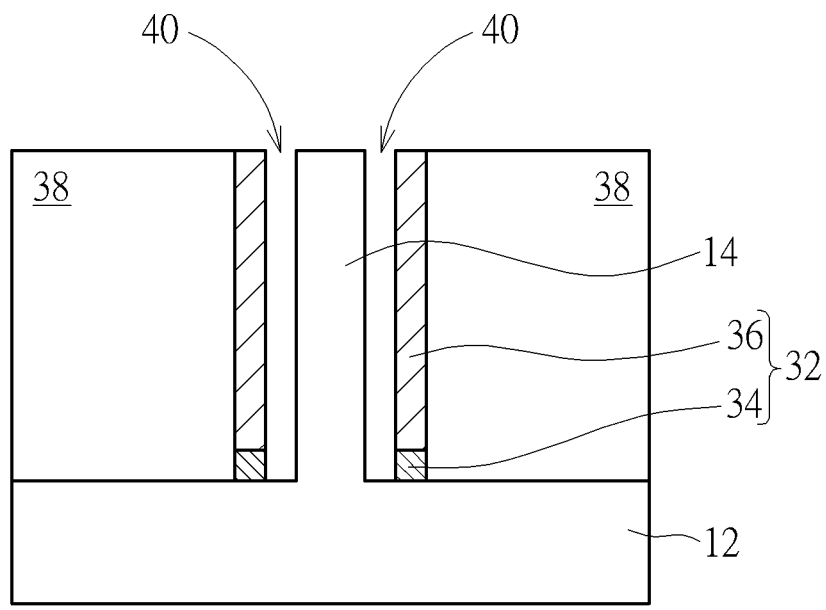
Figure 9:
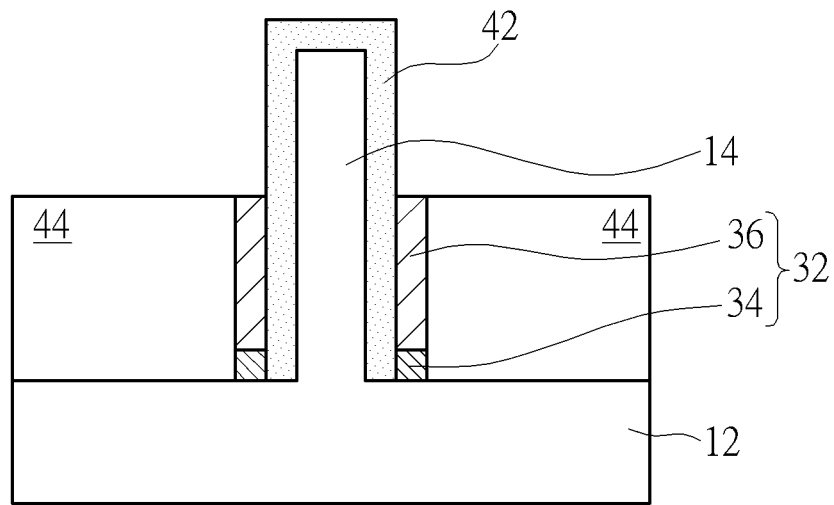

Referring to FIGS. 7-9, FIGS. 7-9 illustrate a method for fabricating a semiconductor device according to an embodiment of the present invention. As shown in FIG. 7, an etching back process could be conducted right after forming the first liner 16 and second liner 18 in FIG. 1 to form a spacer 32 on the sidewalls of the fin-shaped structure 14. Preferably, the spacer 32 further includes a first spacer 34 and a second spacer 36, in which the first spacer 34 contacting the fin-shaped structure 14 is preferably L-shaped while the second spacer 36 sitting on the L-shaped first spacer 34 is preferably I-shaped.

Next, as shown in FIG. 8, an insulating layer 38 could be formed on the substrate 12 to cover the spacer 32 and fin-shaped structure 14, and a planarizing process such as CMP is conducted to remove part of the insulating layer 38 so that the top surface of the fin-shaped structure 14 is even with the top surface of the insulating layer 38. Next, part of the first spacer 34 is removed so that an edge of the remaining first spacer 34 is aligned with an edge of the second spacer 36, and a recess 40 is formed between the fin-shaped structure 14 and the spacer 32. It should be noted that according to an embodiment of the present invention, part of the insulating layer 38 adjacent to the second spacer 36 may be removed when part of the first spacer 34 is removed, so that the top surface of the remaining insulating layer 38 would be slightly lower than the top surface of the fin-shaped structure 14.

Next, as shown in FIG. 9, an epitaxial growth process is conducted to form a reverse U-shaped epitaxial layer 42 in the recess 40, and an etching process is then conducted to remove part of the insulating layer 38 and part of the second spacer 36 so that the top surfaces of the insulating layer 38 and second spacer 36 are coplanar and lower than the top surface of the epitaxial layer 42. This forms a STI 44 adjacent to the second spacer 36.

Viewing from a structural perspective, the epitaxial layer 42 of this embodiment is disposed between STI 44 and the fin-shaped structure 14, and a first spacer 34 and a second spacer 36 are disposed between the STI 44 and the epitaxial layer 42, in which the second spacer 36 is disposed on the first spacer 34, and both the first spacer 34 and second spacer 36 are I-shaped and contacting the epitaxial layer 42 and STI 44 on the two sides.

Figure 10:
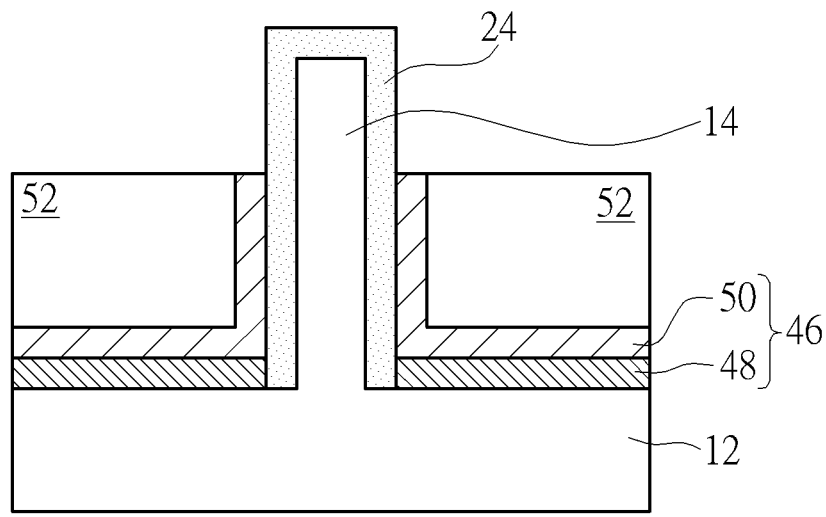
FIG. 10 illustrates a method for fabricating a semiconductor device according to an embodiment of the present invention.

Referring to FIG. 10, FIG. 10 illustrates a method for fabricating a semiconductor device according to an embodiment of the present invention. As shown in FIG. 10, it would be desirable to conduct an etching process to remove part of the vertical portion of the second liner 18 after the epitaxial layer 24 is formed in FIG. 5. This forms a spacer 46 adjacent to the epitaxial layer 24, in which the spacer 46 includes an I-shaped first spacer 48 disposed on the substrate 12 surface and a L-shaped second spacer 50 sitting on the first spacer 48. The top surface of the vertical portion of the second spacer 50 is slightly lower than the top surface of the epitaxial layer 24. Next, a STI fabrication process could be conducted by first depositing an insulating layer (not shown) on the substrate 12 to cover the spacer 46 and epitaxial layer 24, and a planarizing process such as CMP is conducted to remove part of the insulating layer so that the top surfaces of the epitaxial layer 24 and insulating layer are coplanar. Next, an etching process is conducted to remove part of the insulating layer and even part of the second spacer 50 for forming a STI 52. Preferably, the top surface of the STI 52 is even with the top surface of the vertical portion of the second spacer 50 and the top surfaces of both STI 52 and second spacer 50 are lower than the top surfaces of the epitaxial layer 24 and fin-shaped structure 14.

Viewing from a structural perspective, the epitaxial layer 24 of this embodiment is disposed between the STI 52 and the fin-shaped structure 14, and a first spacer 48 and second spacer 50 are disposed between the STI 52 and the epitaxial layer 24, in which the second spacer 50 is sitting on the first spacer 48, the first spacer 48 is I-shaped, and the second spacer 50 is L-shaped.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a fin-shaped structure on a substrate;
   forming a first liner on the substrate and the fin-shaped structure;
   forming a second liner on the first liner;
   removing part of the second liner and part of the first liner to expose a top surface of the fin-shaped structure;
   removing part of the first liner between the fin-shaped structure and the second liner to form a recess, wherein the recess exposes a top surface of the substrate; and
   forming an epitaxial layer in the recess.

2. The method of claim 1, further comprising:
   forming a sacrificial layer on the second liner;
   planarizing part of the sacrificial layer;
   removing part of the second liner and part of the first liner to expose the top surface of the fin-shaped structure;
   removing part of the first liner and the sacrificial layer to form the recess.

3. The method of claim 2, wherein the sacrificial layer comprises silicon oxide.

4. The method of claim 1, further comprising:
   removing part of the first liner between the fin-shaped structure and the second liner so that an edge of the remaining first liner is aligned with an edge of the second liner.

5. The method of claim 1, wherein the recess is reverse U-shaped.

6. The method of claim 1, further comprising:
   planarizing part of the epitaxial layer so that a top surface of the epitaxial layer and a top surface of the second liner are coplanar; and
   removing the second liner and the first liner completely.

7. The method of claim 1, wherein the epitaxial layer is reverse U-shaped.

8. The method of claim 1, wherein the first liner and the second liner comprise different material.

9. The method of claim 1, wherein the first liner comprises silicon oxide.

10. The method of claim 1, wherein the second liner comprises silicon nitride.

11. A semiconductor device, comprising:
    a substrate;
    a fin-shaped structure on the substrate;
    an epitaxial layer on the fin-shaped structure, wherein the epitaxial layer is over a top surface and sidewalls of the fin-shaped structure and directly contacting a top surface of the substrate, and the epitaxial layer is reverse U-shaped;
    a shallow trench isolation (STI) around the epitaxial layer, wherein the STI contacts the substrate directly; and
    a spacer between the STI and the epitaxial layer, wherein the spacer contacts the STI, the epitaxial layer, and the substrate directly.

12. The semiconductor device of claim 11, wherein the epitaxial layer is between the STI and the fin-shaped structure.

13. A semiconductor device, comprising:
    a substrate;
    a fin-shaped structure on the substrate;
    an epitaxial layer on the fin-shaped structure, wherein the epitaxial layer is over a top surface and sidewalls of the fin-shaped structure and directly contacting a top surface of the substrate, and the epitaxial layer is reverse U-shaped;
    a shallow trench isolation (STI) around the epitaxial layer; and
    a spacer between the STI and the epitaxial layer, wherein the spacer contacts the STI, the epitaxial layer, and the substrate directly.

14. The semiconductor device of claim 13, wherein the spacer comprises:
    a first spacer on the substrate; and
    a second spacer on the first spacer, wherein the second spacer is L-shaped.

15. The semiconductor device of claim 14, wherein the first spacer is I-shaped.

16. The semiconductor device of claim 14, wherein the first spacer and the second spacer comprises different material.

* * * * *